(12) United States Patent
Lu et al.

(10) Patent No.: US 8,236,579 B2
(45) Date of Patent: Aug. 7, 2012

(54) METHODS AND SYSTEMS FOR LITHOGRAPHY ALIGNMENT

(75) Inventors: Hsiao-Tzu Lu, Hsinchu (TW); Hung Chang Hsieh, Hsin-Chu (TW); Kuei Shun Chen, Hsin-Chu (TW); Hsueh-Hung Fu, Hsinchu (TW); Ching-Hua Hsieh, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 619 days.

(21) Appl. No.: 11/686,142

(22) Filed: Mar. 14, 2007

(65) Prior Publication Data

US 2008/0233661 A1 Sep. 25, 2008

(51) Int. Cl.
*H01L 21/00* (2006.01)
(52) U.S. Cl. .......... 438/7; 438/6; 438/16; 430/311; 430/330
(58) Field of Classification Search .......... 438/6, 7, 438/16; 430/302, 311, 330; 355/52
See application file for complete search history.

(56) References Cited

U.S. PATENT DOCUMENTS

| | | | |
|---|---|---|---|
| 4,437,922 A * | 3/1984 | Bischoff et al. | 438/795 |
| 5,562,770 A | 10/1996 | Chen et al. | |
| 6,061,119 A | 5/2000 | Ota | |
| 6,803,155 B2 | 10/2004 | Dulman et al. | |
| 6,826,491 B2 | 11/2004 | Jachim | |
| 6,861,331 B2 | 3/2005 | Rossiger et al. | |
| 6,975,974 B2 | 12/2005 | Chien et al. | |
| 7,101,816 B2 | 9/2006 | Kaushal et al. | |
| 7,113,257 B2 | 9/2006 | Brinkhof et al. | |
| 7,119,884 B2 | 10/2006 | Ottens et al. | |
| 7,126,668 B2 | 10/2006 | Smith et al. | |
| 2004/0135981 A1 * | 7/2004 | Ina | 355/55 |
| 2006/0241891 A1 | 10/2006 | Kaushal et al. | |
| 2007/0096300 A1 * | 5/2007 | Wang et al. | 257/709 |

OTHER PUBLICATIONS

Jin Choi et al., Distortion and Overlay Performance of UV Step and Repeat Imprint Lithography, 2005.

* cited by examiner

*Primary Examiner* — Alexander Ghyka
(74) *Attorney, Agent, or Firm* — Haynes and Boone, LLP

(57) ABSTRACT

Methods and systems for lithographically exposing a substrate based on a curvature profile of the substrate.

18 Claims, 6 Drawing Sheets

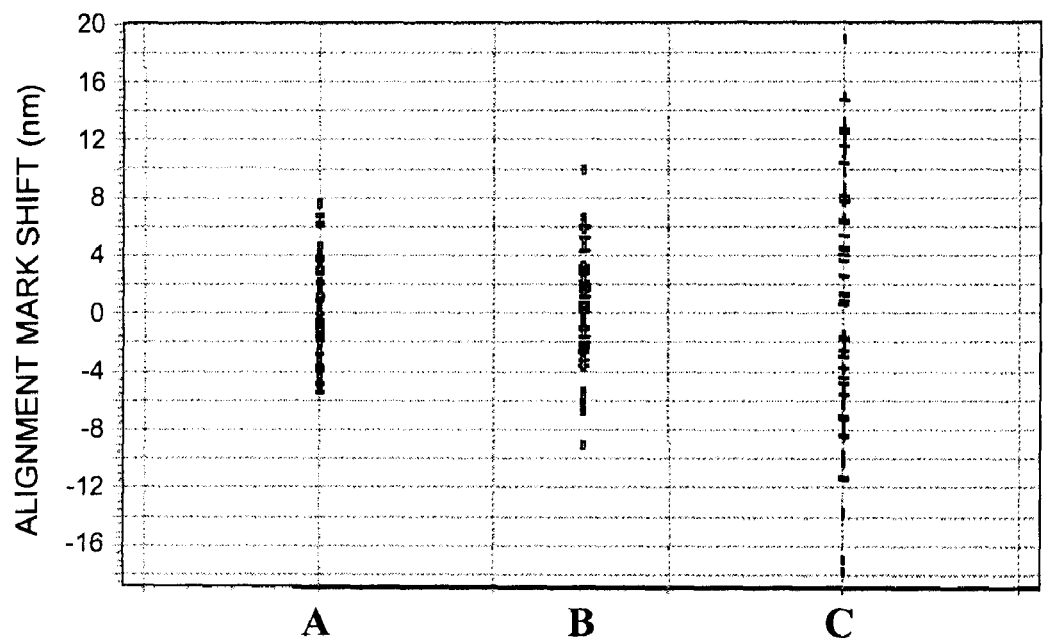
Fig. 2
(PriorArt)
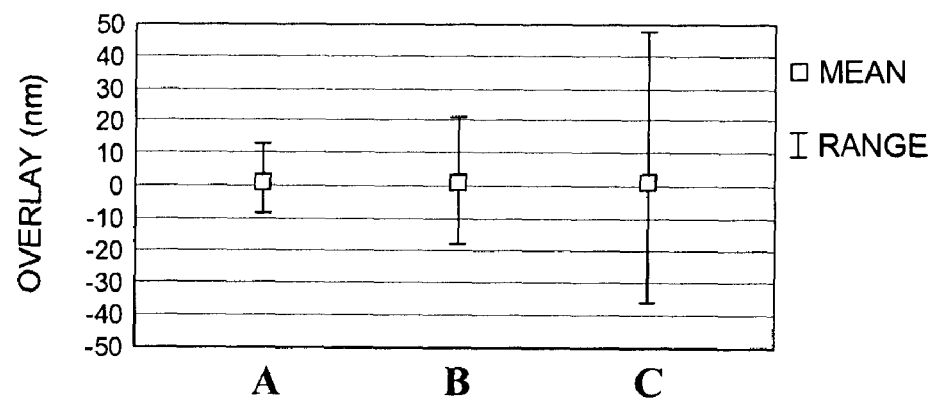
Fig. 3
(PriorArt)

METHODS AND SYSTEMS FOR LITHOGRAPHY ALIGNMENT

BACKGROUND

Photolithography or optical lithography is a process used in semiconductor device fabrication to transfer a pattern from a photomask or reticle to the surface of a substrate. Often, crystalline silicon in the form of a wafer is used as a choice of substrate, although glass, sapphire and metal may alternatively or additionally be used, among other materials.

A typical lithography procedure would begin by depositing a layer of conductive metal or other material on the substrate. A layer of photoresist is then formed over the metal layer. A photomask is then placed between a source of illumination and the wafer to selectively expose parts of the substrate to light. The photoresist is then developed, by which areas of unhardened photoresist undergo a chemical change. After a hard-bake, subsequent chemical treatments etch away the portions of the metal layer under the developed photoresist, and then etch away the hardened photoresist, leaving the patterned metal layer.

A commonly used approach for photolithography is projection lithography, in which a desired pattern is projected from the photomask onto the wafer in a machine called a scanner. In a scanner, light from a mercury arc lamp or excimer laser is focused onto a "mask" or reticle containing the desired image. The light passes through the mask and is then focused to produce the desired image on the wafer through a reduction lens system. The reduction of the system can vary depending on design, but is typically on the order of 4×-5× in magnitude.

When the image is projected onto the wafer, the photoresist material undergoes wavelength-specific radiation-sensitive chemical reactions, which cause the regions exposed to light to be either more or less acidic. If the exposed regions become more acidic, the material is called a positive photoresist, while if it becomes less susceptible it is a negative photoresist. The resist is then developed by exposing it to an alkaline solution that removes either the exposed (positive) photoresist or the unexposed (negative) photoresist.

Lithography is used because it affords precise control over the shape and size of the objects it creates, and because it can create patterns over an entire surface simultaneously. However, the process does have its pitfalls.

For example, an important process for enhancing device performance in IC fabrication for technologies at 65 nm and beyond is surface annealing. However, surface annealing processes can cause the wafer to bend or bow as a result of stress disparities between adjacent layers formed on the substrate and in the substrate itself. The resulting wafer curvature can shift alignment marks, making subsequent lithography alignment difficult and inducing poor overlay performance.

Current scanner alignment correction includes translation, rotation, non-orthogonality and expansion. However, these corrections may not always be sufficient to correct for the wafer curvature resulting from thermal processing.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a chart depicting alignment mark shift that conventionally results from three different annealing processes.

FIG. 3 is a graph depicting overlay performance that conventionally results from three different annealing processes.

DETAILED DESCRIPTION

Figure 1A:
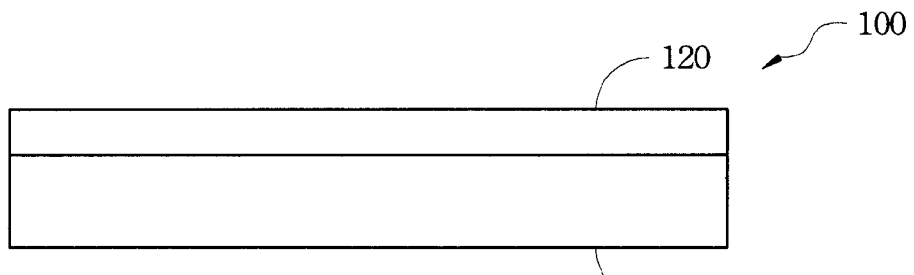
FIGS. 1a-1c are sectional views of a partially completed semiconductor apparatus in various stages of conventional manufacture.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1a, illustrated is a sectional view of a partially completed semiconductor apparatus 100 in an intermediate stage of conventional manufacture. The apparatus 100 includes a substrate or wafer 110 (the words "substrate" and "wafer" are used interchangeably herein) and a material layer 120 formed thereon. The material layer 120 may have a conductive or dielectric composition and may be formed by one or more conventional or future-developed manufacturing processes. In an exemplary embodiment, the material layer 120 is a photoresist layer, either prior to or after exposure.

Figure 1B:
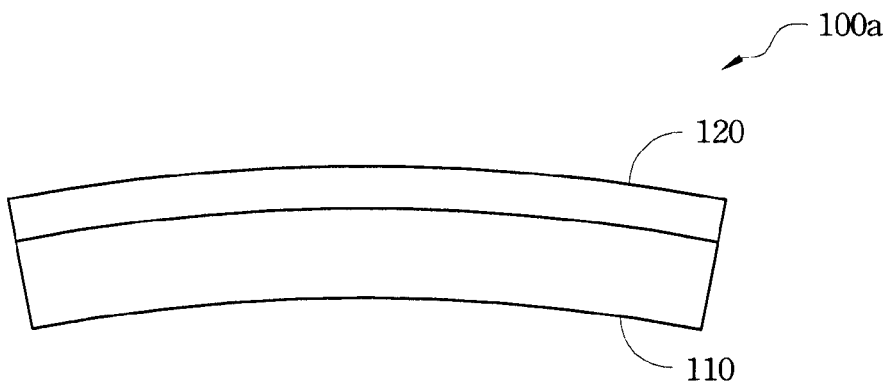

Referring to FIG. 1b, illustrated is a sectional view of the apparatus 100 shown in FIG. 1a in a subsequent stage of manufacture, herein designated by reference numeral 100a. As shown in FIG. 1b, an annealing process may give rise to tensile stress in the substrate 110, which can cause the substrate 110 and the material layer 120 to take on a generally concave shape.

Figure 1C:
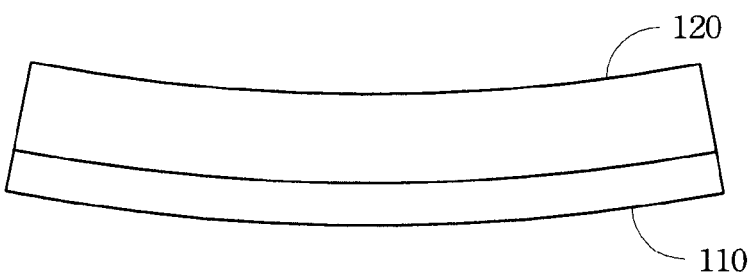

Referring to FIG. 1c, illustrated is a sectional view of the apparatus 100 shown in FIG. 1a in a subsequent stage of manufacture, herein designated by reference numeral 100b. As shown in FIG. 1c, the annealing process may alternatively give rise to compressive stress in the substrate 110, which can cause the substrate 110 and the material layer 120 to take on a generally convex shape.

FIGS. 1b and 1c demonstrate that the substrate 110 may experience wafer bowing or otherwise take on a non-planar profile in response to undergoing one or more heat treatment processes. However, the curvature profile may not be as uniform as in the embodiments depicted in FIGS. 1b and 1c. For example, some portions of the substrate 110 may have a convex curvature, while other portions of the substrate 110 may simultaneously have a concave curvature. Additionally, the amount of curvature may vary across different portions of the substrate 110.

Referring to FIG. 2, illustrated is a chart depicting the alignment mark shift that conventionally results from three different annealing processes, which may be the result of wafer curvature similar to that demonstrated by FIGS. 1b and 1c. Annealing process A is a conventional rapid thermal anneal (RTA). The alignment mark shift resulting from the RTA ranges between about +8 nm and about −6 nm. Annealing process B comprises a conventional RTA and a conventional flash anneal at a flash energy of 25 J. The alignment mark shift resulting from the RTA and 25 J flash anneal ranges between about +10 nm and about −10 nm. Annealing process B comprises a conventional RTA and a conventional flash anneal at a flash energy of 27 J. The alignment mark shift resulting from the RTA and 27 J flash anneal ranges between about +20 nm and about −18 nm.

Referring to FIG. 3, illustrated is a graph depicting the photo misalignment or other overlay performance that conventionally results from three different annealing processes, which may be the result of wafer curvature similar to that demonstrated by FIGS. 1b and 1c. The overlay performance may result from alignment mark shift that conventionally results from the different annealing processes. Annealing process A is a conventional RTA. The overlay performance resulting from the RTA ranges between about +12 nm and about −8 nm, or a range of about 20 nm. Annealing process B comprises a conventional RTA and a conventional flash anneal at a flash energy of 25 J. The overlay performance resulting from the RTA and 25 J flash anneal ranges from more than +20 nm to almost −20 nm, or a range of about 40 nm. Annealing process B comprises a conventional RTA and a conventional flash anneal at a flash energy of 27 J. The overlay performance resulting from the RTA and 27 J flash anneal ranges from almost +50 nm to more than about −35 nm, or a range of about 80 nm.

FIGS. 2 and 3 demonstrate that not only can annealing processes cause wafer curvature that results in alignment mark shift and poor overlay performance, but also that the amount of alignment mark shift and/or decreased overlay performance can change depending on the particular annealing process to which the wafer is subjected. This disadvantage is multiplied where the wafer is subjected to more than one annealing process.

Applicants have shown through experimentation that alignment mark shift and poor overlay performance, such as depicted in FIGS. 2 and 3, can be strongly correlated to wafer curvature. This was an unexpected result. For example, the alignment mark shift shown in FIGS. 2 and 3 can be correlated to the wafer curvature shown in FIG. 4. Consequently, wafer curvature can be taken into account as a pre-process measurement to ensure precise process control. For example, pre-process measurement of wafer curvature may be embedded into scanner hardware and/or software, or otherwise utilized by the scanner during operation.

Figure 4:
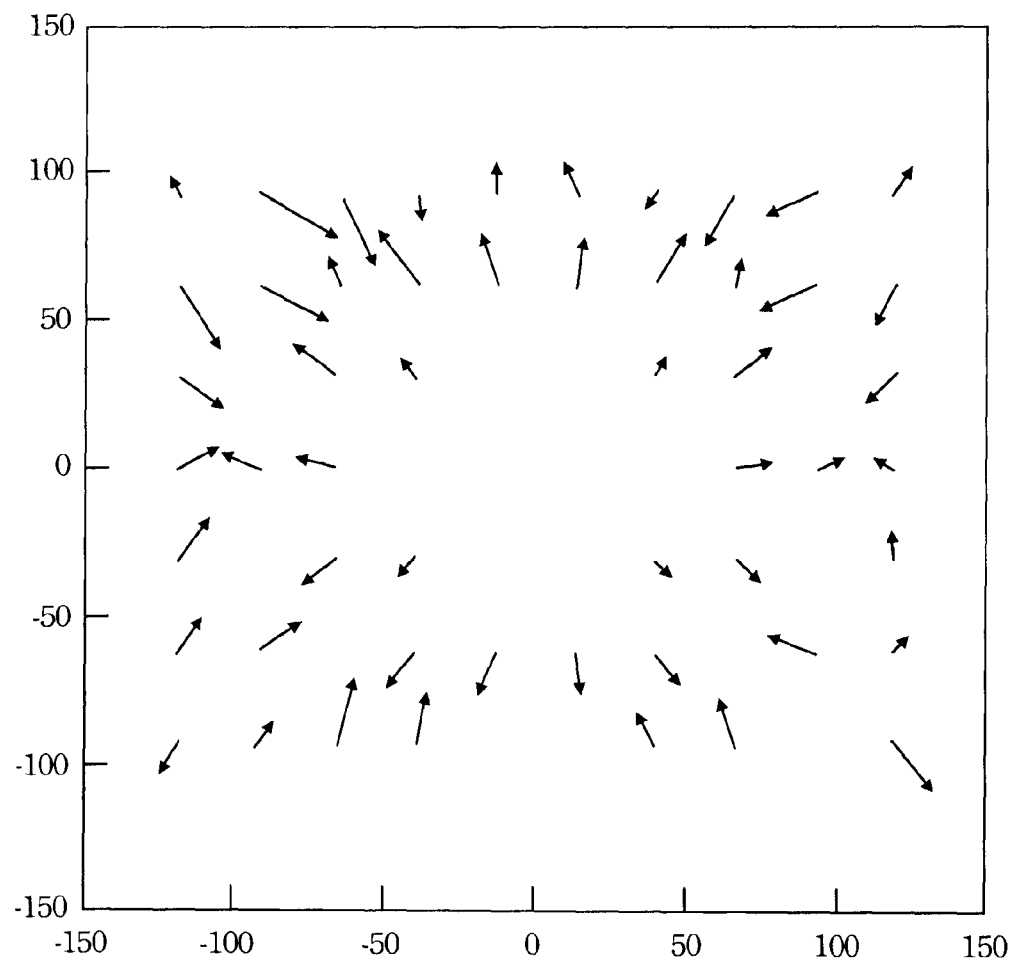
FIG. 4 is a graphical depiction of wafer curvature according to one or more aspects of the present disclosure.

FIG. 4 is an example, graphical depiction of the curvature at a plurality of locations across the substrate. The wafer curvature map of FIG. 4 shows both the quantitative curvature and the curvature direction at various positions across a substrate, such positions being indicated numerically along the horizontal and vertical indices of the map. However, other representations of wafer curvature within the scope of the present disclosure may be purely textual or a combination of text and graphics.

The wafer curvature depicted in FIG. 4 may be determined by an optical and/or mechanical profiler, such as the CGS-300 commercially available from Oraxion, Inc., the Flexus commercially available from Brumley South, Inc., or the FX100 commercially available from KLA-Tencor. However, other conventional or future-developed metrology tools may alternatively or additionally be employed to measure or otherwise determine wafer curvature within the scope of the present disclosure. Additionally, the wafer curvature may be measured globally across the entire wafer or locally in different portions of the surface of the substrate.

Figure 5:
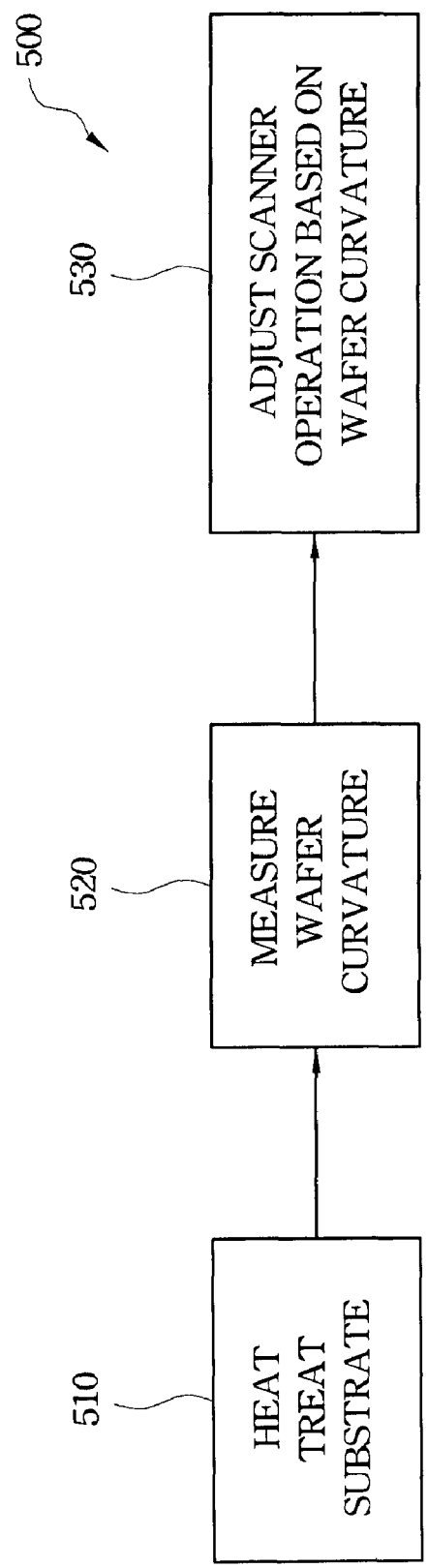
FIG. 5 is a flow-chart diagram of at least a portion of a method according to one or more aspects of the present disclosure.

Referring to FIG. 5, illustrated is a flow-chart diagram of at least a portion of a method 500 according to one or more aspects of the present disclosure. The method 500 includes a step 510 during which a substrate is heat treated. The heat treatment of step 510 may be or include a conventional or other RTA process. Additionally, or alternatively, the heat treatment of step 510 may be or include a conventional or other flash anneal, such as a flash anneal at a flash energy of 25 J or a flash anneal at a flash energy of 27 J, among other heat treatment processes. The heat treatment of step 510 may also include subjecting the substrate to more than one heat treatment process. In any case, the heat treated substrate resulting from step 510 may be bowed or otherwise experience wafer curvature.

Accordingly, the method 500 also includes a step 520 during which the wafer curvature is measured or otherwise determined, as described above. Consequently, the wafer curvature determined during step 520 may be subsequently utilized in step 530 to adjust scanner operation and thereby take into account the wafer curvature that would otherwise adversely affect alignment mark shift and overlay performance. The scanner operation adjustment of step 530 may be performed by a dedicated module configured to adjust the scanner operation parameters based on the wafer curvature determined during step 520. Alternatively, or additionally, the scanner operation adjustment of step 530 may be performed by the scanner itself, such as where the adjustment capability is embedded within the hardware and/or software of the scanner.

Moreover, the processing contemplated by step 530 is not limited the scanner operation depicted in the example shown in FIG. 5. That is, the wafer curvature determined during step 520 may be utilized to adjust a variety of lithographic and optical processing operations, whether with a conventional or future-developed scanner or other processing tools. Thus, wafer curvature can be measured before any such lithography or other process and then fed forward to the appropriate process tools, and such embodiments are within the scope of the present disclosure.

Figure 6:
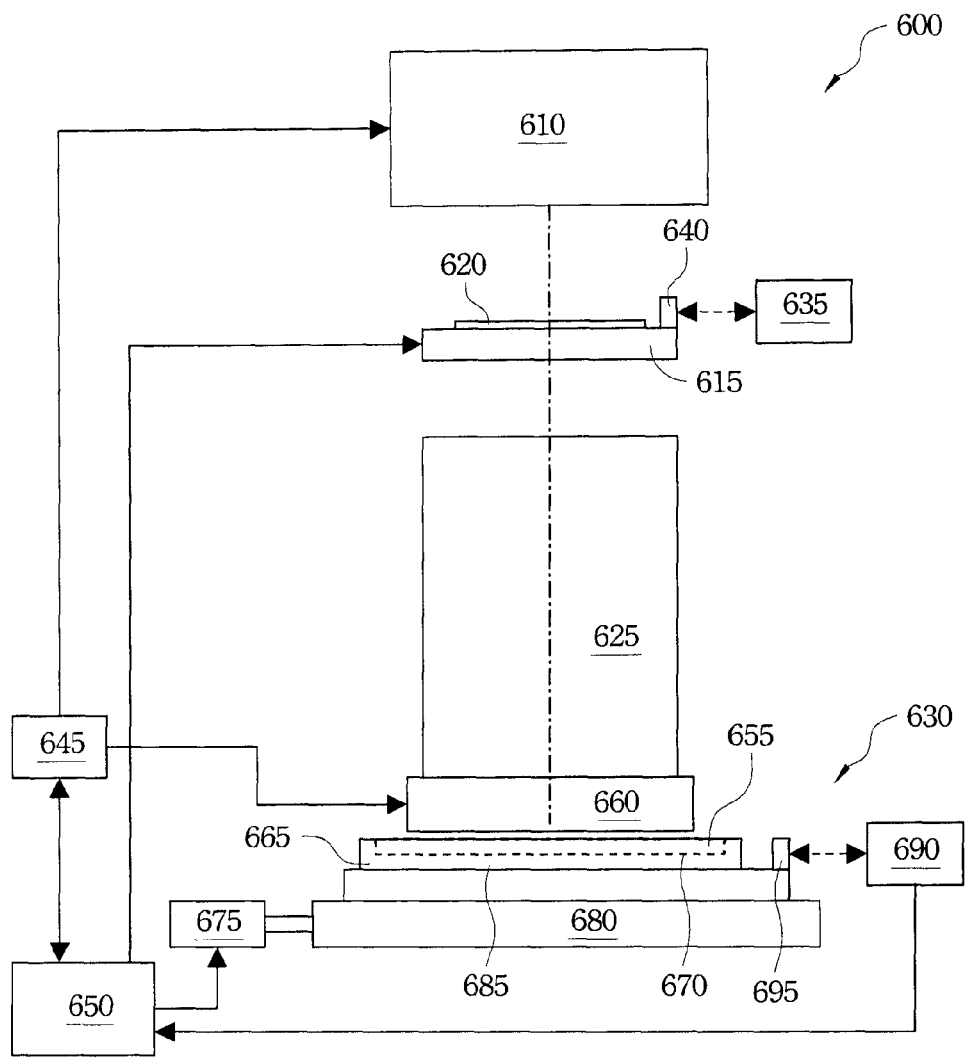
FIG. 6 is a schematic view of at least a portion of an apparatus according to one or more aspects of the present disclosure.

Referring to FIG. 6, illustrated is a schematic view of at least a portion of apparatus 600 demonstrating one or more aspects of an environment in which one or more aspects of the present disclosure may be implemented. The apparatus 600 may be, include, or be included in a scanner or other lithography system according to one or more aspects of the present disclosure.

The apparatus 600 comprises an illumination system 610, a reticle stage 615 configured to hold a reticle 620, a projection unit 625, and a stage unit 630. Among other possible components, the illumination system 610 may include a light source, an illuminance uniformity optical system (such as may include an optical integrator or the like), a beam splitter, a relay lens, a filter, and/or a reticle blind (none of which are shown). In illumination system 610, an illumination or exposure light illuminates through an exposure slit (such as may be set by the reticle blind) and onto the reticle 620 where the circuit pattern or the like is fabricated with substantially uniform illuminance. The illumination or exposure light may comprise an ArF excimer laser beam (e.g., wavelength of 193 nm), a far ultraviolet light such as the KrF excimer laser beam (e.g., wavelength of 248 nm), or bright lines in the ultraviolet region generated by an ultra high-pressure mercury lamp (such as the g-line or the i-line), among others. The illumination system 610 may also comprise a fly-eye lens, a rod integrator (an internal reflection type integrator), and/or a diffraction optical element, such as may be a component of the optical integrator.

The reticle 620 is secured to the reticle stage 615 by vacuum, for example. The reticle stage 615 may be drivable in an XY plane perpendicular to the optical axis of the illumination system 610 by a reticle stage drive section, such as may comprise one or more linear motors or other motion-inducing components. The reticle stage 615 may be drivable in a predetermined scanning direction, such as along the Y-axis shown in FIG. 6.

The position of the reticle stage 615 within its moving plane may be detected periodically or at all times via a reticle laser interferometer 635 via a movable mirror 640, possibly at a resolution of ranging between about 0.5 nm and about 1.0 nm. The reticle stage 615 may comprise a movable mirror that has a reflection surface orthogonal to the Y-axis direction and another movable mirror that has a reflection surface orthogonal to an X-axis direction, as well as a reticle Y interferometer and a reticle X interferometer corresponding to such mirrors. However, in FIG. 6, such an embodiment and others are schematically represented by movable mirror 640 and reticle interferometer 635.

Information describing the position of the reticle stage 615 may be communicated from reticle interferometer 635 to a main controller 645, such as via a stage control unit 650. The stage control unit 650 may be configured to drive and/or control the reticle stage 615 via the reticle stage drive section, based on the positional information of the reticle stage 615 and in response to instructions from the main controller 645.

The optical axis of the projection unit 625 may coincide with the optical axis of the illumination system 610. The projection unit 625 may comprise a barrel-shaped structure housing a projection optical system that includes a plurality of lenses, lens elements, and/or other optical elements which share the same optical axis in the Z-axis direction and are held at a predetermined positional relationship within the housing. For example, a both-side telecentric dioptric system having a predetermined projection magnification (e.g., ¼× or ⅕×) may be employed. Accordingly, when exposure light from the illumination system 610 illuminates the illumination area on the reticle 620, the illumination light that passes through the reticle 620 may the pass through the projection unit 625 and form a reduced image of the circuit pattern within the illumination area on the reticle 620 (a partial reduced image of the circuit pattern) on the wafer or substrate 655, whose surface may be coated with a resist and/or other photosensitive material.

The apparatus 600 may also comprise a liquid supply/drainage unit 660, such that the apparatus 600 may be configured for use in immersion lithography processing. The liquid supply/drainage unit 660 may be attached to the projection unit 625 so that it surrounds the lower end of the projection unit 625.

The stage unit 630 may comprise a wafer stage 665, a wafer holder 670 provided on the wafer stage 665, and a wafer stage drive section 675 which is configured to drive the wafer stage 665 and wafer holder 670. The wafer stage 665 comprises an XY stage 680, such as may be driven in the XY direction by linear motors and/or other components. The wafer stage 665 also comprises a Z stage 685, such as may be mounted on the XY stage 680 and may be configured to provide movement in the Z-axis direction and/or in an inclination direction with respect to the XY plane (the rotational direction around the X-axis ($\Omega X$) and the rotational direction around the Y-axis ($\Omega Y$)), such as by a Z tilt drive mechanism. The XY stage 680 may also be configured to be movable not only in the scanning direction (the Y-axis direction) but also in a non-scanning direction (the X-axis direction) perpendicular to the scanning direction.

The XY stage 680 and the Z stage 685 may be collectively referred to as a wafer stage. The position of wafer stage within the XY plane, possibly including rotation around the Z-axis ($\Omega Z$) is detected periodically or at all times by a wafer laser interferometer 690, such as via a movable mirror 695 provided on the upper surface of the Z tilt stage 685, possibly at a resolution ranging between about 0.5 nm and about 1 nm, for example. Such configuration may also comprise a dual-mirror, dual-interferometer configuration as described above with regard to the reticle stage 615.

Positional and/or velocity (speed) information regarding the wafer stage may be communicated to the stage control unit 650, and then to main controller 645. The stage control unit 650 may be configured to control the wafer stage via the wafer stage drive section 675 based on the positional and/or velocity information of the wafer stage, such as in response to instructions from the main controller 645.

The position and/or velocity of the wafer stage and/or the reticle stage 615 may be configured to be adjusted based on a wafer curvature profile. As described above with respect to FIG. 5, the means for determining the wafer curvature profile may be integral to the apparatus 600, or may be discrete apparatus separate from the apparatus 600. In either case, the wafer curvature profile information is fed to the apparatus 600 to be utilized during operation of the apparatus 600. Accordingly, because the wafer curvature profile is utilized to adjust the operational parameters of the apparatus 600, alignment mark shift may be significantly reduced or eliminated, and overlay performance may be improved. Thus, the wafer curvature profile can be taken into account as a pre-process measurement to ensure precise process control during operation of the apparatus 600.

Figure 7:
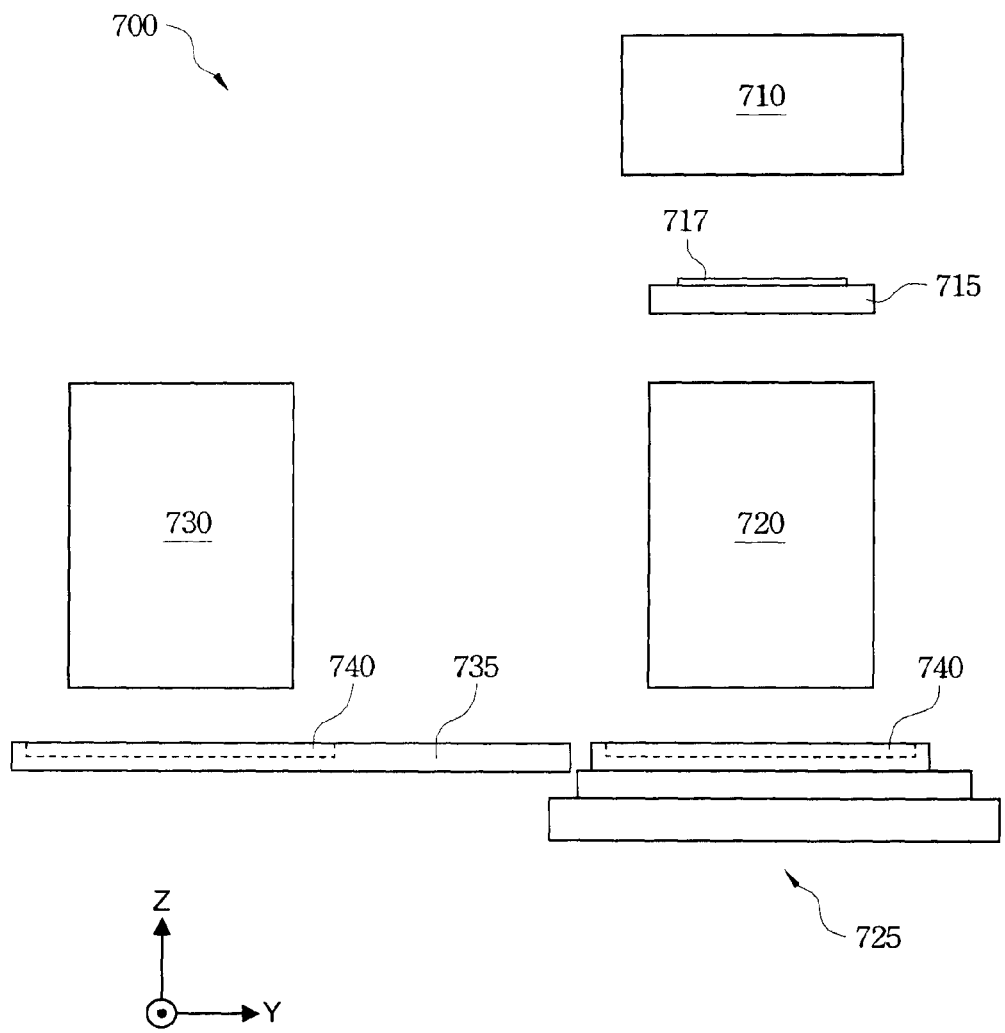
FIG. 7 is a schematic view of at least a portion of an apparatus according to one or more aspects of the present disclosure.

Referring to FIG. 7, illustrated is a schematic view of at least a portion of an apparatus 700 according to one or more aspects of the present disclosure. The apparatus 700 may be substantially similar to the apparatus 600 shown in FIG. 6, except as described below.

The apparatus 700 includes an illumination system 710, a reticle stage 715, a projection unit 720 and a wafer stage 725, which may be substantially similar to the illumination system 610, the reticle stage 615, the projection unit 625 and the stage unit 630, respectively, shown in FIG. 6. The reticle stage 715 is configured to retain a reticle 717, and the wafer stage 725 is configured to retain a wafer 740. The reticle stage 715 and wafer stage 725 may be drivable in X, Y and Z directions, collectively, such as by means described above with respect to FIG. 6.

The apparatus 700 also includes a wafer curvature profiler 730 and a conveyor system 735. The waver curvature profiler 730 may be integral or otherwise co-located with the other components of the apparatus 700, or may alternatively be remotely located from the other components of the apparatus 700. In either case, the conveyor system 735 is configured to transport a wafer 740 from the wafer curvature profiler 730 to the wafer stage 725 after determining the curvature profile of the wafer 740. Consequently, the curvature profile of the wafer 740 may be taken into account during operation of the illumination system 710, reticle stage 715, projection unit 720 and wafer stage 725.

For example, the illumination system 710, reticle stage 715, projection unit 720 and wafer stage 725 may be components of a scanner, stepper or other photolithography or optical lithography system. The position and/or other operational aspect of the reticle stage 715, projection unit 720 and/or wafer stage 725 may be adjustable based the curvature profile of the wafer 740 as determined by the profiler 730, such that the lithography process can be adjusted to take into account the curvature profile of the wafer 740. For example, where the curvature profile of the wafer 740 correlates to an alignment mark shift of a certain amount and direction, the position of the reticle stage 715 and/or the wafer stage 725 may be repositioned by the shift amount in an opposite direction of the shift. However, other schemes for adjusting the operation of the apparatus 700 based on the wafer curvature profile are also within the scope of the present disclosure.

In view of all of the foregoing, it should be readily apparent to those skilled in the art that the present disclosure introduces a method of processing a substrate that includes determining a curvature profile of the substrate and then lithographically exposing portions of the substrate based on the curvature profile. Such method may further include subjecting the substrate to a heat treatment process before determining the curvature profile of the substrate. The heat treatment process may comprise a rapid thermal anneal (RTA) process and/or a flash anneal process. Determining the wafer curvature profile may comprise simultaneously determining the wafer curvature profile substantially globally across the substrate, or determining wafer curvature locally at a plurality of different portions of the substrate. Lithographically exposing portions of the substrate may utilize a scanner or other photolithography or optical lithography apparatus.

A system for processing a substrate that is also introduced in the present disclosure includes means for determining a curvature profile of the substrate and means for lithographically exposing portions of the substrate based on the curvature profile. The system may further comprise means for subjecting the substrate to a heat treatment process before determining the curvature profile of the substrate. The heat treatment process may comprise a rapid thermal anneal (RTA) process and/or a flash anneal process.

A scanner system that is also introduced in the present disclosure includes a reticle stage configured to retain a reticle, a wafer stage configured to retain a wafer, a projection unit interposing the reticle stage and the wafer stage, and an illumination source configured to emit light through the reticle and the projection unit and onto the wafer, wherein at least one of the reticle stage and the wafer stage is configured to be positionally adjusted to account for a curvature profile of the wafer. The scanner system may further comprise a wafer curvature profiler configured to determine the curvature profile of the wafer, and/or a conveyor configured to transport the wafer from the wafer curvature profiler to the wafer stage. The wafer curvature profiler may be remotely located from the wafer stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of processing a substrate with an alignment mark, the method comprising:
   subjecting the substrate to a heat treatment process wherein an alignment mark shift occurs;
   subsequent to the subjecting, placing and holding the substrate on a stage;
   determining a curvature profile of the substrate while held on the stage; and
   lithographically exposing portions of the substrate while held on the stage and utilizing the curvature profile to adjust a scanner operation to account for wafer curvature induced by the heat treatment process, wherein an effect of said alignment mark shift is reduced.

2. The method of claim 1 wherein the heat treatment process comprises a rapid thermal anneal (RTA) process.

3. The method of claim 2 wherein the heat treatment process further comprises a flash anneal process.

4. The method of claim 1 wherein the heat treatment process comprises a flash anneal process.

5. The method of claim 1 wherein determining the wafer curvature profile comprises simultaneously determining the wafer curvature profile substantially globally across the substrate.

6. The method of claim 1 wherein determining the wafer curvature profile comprises determining wafer curvature locally at a plurality of different portions of the substrate.

7. The method of claim 1 wherein lithographically exposing portions of the substrate utilizes a scanner.

8. A method of processing a substrate with a pattern, the method comprising:
   subjecting the patterned substrate to a heat treatment process comprising one of a rapid thermal anneal (RTA) process and a flash anneal process wherein a pattern shift occurs;
   subsequent to the subjecting, determining a curvature profile of the substrate;
   placing the patterned substrate on a stage; and
   lithographically exposing portions of the substrate while on the stage, utilizing the curvature profile to adjust a scanner operation to account for the pattern shift.

9. The method of claim 8 wherein the heat treatment process comprises an RTA process, the heat treatment process further comprising a flash anneal process.

10. The method of claim 9 wherein determining the wafer curvature profile comprises simultaneously determining the wafer curvature profile substantially globally across the substrate.

11. The method of claim 9 wherein determining the wafer curvature profile comprises determining wafer curvature locally at a plurality of different portions of the substrate.

12. The method of claim 9 wherein lithographically exposing portions of the substrate utilizes a scanner.

13. A method of processing a semiconductor wafer, comprising:
   patterning the semiconductor wafer;
   performing a process on the patterned semiconductor wafer, wherein after the process, a surface of the semiconductor wafer becomes curved;
   measuring an amount of curvature in the curved surface of the semiconductor wafer;
   determining a curvature profile of the curved surface of the semiconductor wafer;
   providing the curvature profile to a lithographic system;

placing the semiconductor wafer with the curved surface on an adjustable stage of the lithographic system;

adjusting the stage of the lithographic system in response to the curvature profile; and exposing the curved surface while the semiconductor wafer is on the adjusted stage in the lithographic system.

14. The method of claim 13 wherein after the process, an alignment mark on the semiconductor wafer is shifted.

15. The method of claim 13 wherein the process includes at least one of a rapid thermal anneal (RTA) process and a flash anneal process.

16. The method of claim 13 wherein determining the wafer curvature profile comprises simultaneously determining the wafer curvature profile substantially globally across the semiconductor wafer.

17. The method of claim 13 wherein determining the wafer curvature profile comprises determining wafer curvature locally at a plurality of different portions of the semiconductor wafer.

18. The method of claim 13 wherein the lithographic system includes a scanner.

* * * * *